United States Patent
Wang et al.

(10) Patent No.: US 11,596,062 B2
(45) Date of Patent: Feb. 28, 2023

(54) SUBSTRATE MOTHERBOARD AND MANUFACTURING METHOD THEREOF, DRIVING SUBSTRATE AND DISPLAY DEVICE

(71) Applicants: Hefei Xinsheng Optoelectronics Technology Co., Ltd., Anhui (CN); BOE TECHNOLOGY GROUP CO., LTD., Beijing (CN)

(72) Inventors: Jie Wang, Beijing (CN); Chunjian Liu, Beijing (CN); Jie Lei, Beijing (CN); Jian Tian, Beijing (CN); Xintao Wu, Beijing (CN); Qin Zeng, Beijing (CN); Zouming Xu, Beijing (CN)

(73) Assignees: Hefei Xinsheng Optoelectronics Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/353,992

(22) Filed: Jun. 22, 2021

(65) Prior Publication Data
US 2022/0104348 A1   Mar. 31, 2022

(30) Foreign Application Priority Data
Sep. 30, 2020   (CN) .......................... 202011061850.4

(51) Int. Cl.
*H05K 1/02*   (2006.01)
*G09G 3/32*   (2016.01)

(52) U.S. Cl.
CPC ............. *H05K 1/0298* (2013.01); *G09G 3/32* (2013.01); *G09G 2300/0408* (2013.01); *H05K 2201/10128* (2013.01)

(58) Field of Classification Search
CPC ......... G06F 3/0446; G06F 2203/04103; G06F 3/0443
See application file for complete search history.

(56) References Cited

U.S. PATENT DOCUMENTS

| | | | |
|---|---|---|---|
| 10,795,219 B2* | 10/2020 | He | G02F 1/136286 |
| 2013/0278521 A1* | 10/2013 | Kim | G06F 3/0412 156/60 |
| 2014/0166959 A1* | 6/2014 | Bertin | H01L 29/861 257/2 |

(Continued)

*Primary Examiner* — Van N Chow
(74) *Attorney, Agent, or Firm* — Houtteman Law LLC

(57) ABSTRACT

The present disclosure provides a substrate motherboard including: a first substrate base, a first conductive pattern layer, at least one first insulating layer and a second conductive pattern layer which are sequentially arranged. The first conductive pattern layer includes a plurality of signal lines in the active region. The second conductive pattern layer includes a plurality of connection terminals in the active region, and the plurality of connection terminals are electrically coupled to corresponding signal lines in the plurality of signal lines. The substrate motherboard further includes a plurality of leading-out wires and a plurality of detection terminals in the non-active region, first ends of the plurality of leading-out wires are electrically coupled to corresponding connection terminals and extending to the non-active region to be electrically coupled to corresponding detection terminals through second ends thereof.

17 Claims, 8 Drawing Sheets

(56) References Cited

U.S. PATENT DOCUMENTS

| | | | |
|---|---|---|---|
| 2014/0267953 A1* | 9/2014 | Kim | G06F 3/0443 349/12 |
| 2018/0197918 A1* | 7/2018 | Bertin | H01L 45/165 |
| 2021/0157207 A1* | 5/2021 | Zhang | G02F 1/136286 |

* cited by examiner

SUBSTRATE MOTHERBOARD AND MANUFACTURING METHOD THEREOF, DRIVING SUBSTRATE AND DISPLAY DEVICE

CROSS-REFERENCE TO RELATED APPLICATIONS

The present application claims the priority of the Chinese Patent Application No. 202011061850.4, filed on Sep. 30, 2020 at the Chinese Intellectual Property Office, the content of which is incorporated herein by reference in its entirety

TECHNICAL FIELD

The present disclosure relates to the field of display technology, and in particular to a substrate motherboard and a manufacturing method thereof, a driving substrate and a display device.

BACKGROUND

Micro/Mini light emitting diode (Micro/Mini-LED) display technology as new display technology has the advantages of high brightness, excellent light emitting efficiency, low power consumption, and the like. A driving substrate is a key in a LED display device. In the actual production, firstly, functional film layers are prepared on a surface of a large-size substrate base to form a substrate motherboard; and then the substrate motherboard is cut by a cutting device (typically a laser cutter) to obtain small-sized driving substrates.

Before a substrate motherboard is cut, various tests, such as an open and short circuit test, are performed on the substrate motherboard, and a production line is adjusted or a fault location on the substrate motherboard is repaired based on the test result, so as to enhance yield.

SUMMARY

According to one aspect of the present disclosure, a substrate motherboard is provided. The substrate motherboard includes a first substrate base including an active region for a driving substrate and a non-active region surrounding the active region; a first conductive pattern layer on the first substrate base, including a plurality of signal lines in the active region; at least one first insulating layer on a side of the first conductive pattern layer distal to the first substrate base; and a second conductive pattern layer on a side of the at least one first insulating layer distal to the first substrate base, including a plurality of connection terminals in the active region, wherein the plurality of connection terminals are electrically coupled to corresponding signal lines of the plurality of signal lines, wherein the substrate motherboard further includes a plurality of leading-out wires and a plurality of detection terminals, the plurality of detection terminals are in the non-active region, first ends of the plurality of leading-out wires are electrically coupled to at least one connection terminal of the plurality of connection terminals respectively, and the plurality of leading-out wires extend to the non-active region to be electrically coupled to corresponding detection terminals through second ends of the plurality of leading-out wires.

In some embodiments, the active region includes: a display sub-region and a bonding sub-region, the plurality of connection terminals include: multiple first connection terminals and multiple second connection terminals, the multiple first connection terminals are in the display sub-region and used for fixing pins of a pixel driving chip respectively, and the multiple second connection terminals are used for fixing a plurality of conductive pins, which are coupled to each of the plurality of signal lines, of a flexible circuit board in the bonding sub-region; and at least one of the multiple first connection terminals and/or at least one of the multiple second connection terminals are/is coupled to at least one of the plurality of leading-out wires.

In some embodiments, at least one of the multiple first connection terminals and at least one of the multiple second connection terminals each are coupled to one leading-out wire.

In some embodiments, multiple conductive pins of the plurality of conductive pins are coupled to a same signal line, a number of the multiple second connection terminals are respectively fixed with the multiple conductive pins of the plurality of conductive pins, and at least one of the number of the multiple second connection terminals is coupled to a same detection terminal through corresponding leading-out wires.

In some embodiments, the plurality of leading-out wires are in the second conductive pattern layer; and/or the plurality of detection terminals are in the second conductive pattern layer.

In some embodiments, the plurality of leading-out wires do not overlap with the plurality of signal lines in a direction perpendicular to the first substrate base.

In some embodiments, the plurality of leading-out wires are directly coupled to corresponding connection terminals, respectively; or the plurality of leading-out wires are respectively coupled to the corresponding connection terminals through conductive structures which are in the second conductive pattern layer.

In some embodiments, the plurality of leading-out wires has a line width in a range from 50 um to 200 um in a direction parallel to the first substrate base.

In some embodiments, the plurality of leading-out wires has a line width of 100 um.

In some embodiments, the substrate motherboard further includes at least one second insulating layer on a side of the second conductive pattern layer distal to the first substrate base; and vias are provided in the at least one second insulating layer at positions corresponding to where the plurality of connection terminals and the plurality of detection terminals are located, respectively, to expose the plurality of connection terminals and the plurality of detection terminals.

According to one aspect of the present disclosure, a driving substrate is provided. The driving substrate includes: a second substrate base; a first conductive pattern layer on the second substrate base, including a plurality of signal lines; at least one first insulating layer on a side of the first conductive pattern layer distal to the second substrate base; and a second conductive pattern layer on a side of the at least one first insulating layer distal to the second substrate base, including a plurality of connection terminals electrically coupled to corresponding signal lines of the plurality of signal lines; wherein the driving substrate further includes a plurality of leading-out wires, first ends of the plurality of leading-out wires are electrically coupled to at least one of the plurality of connection terminals respectively, and the plurality of leading-out wires extend to an edge of the second substrate base.

In some embodiments, the edge of the second substrate base is provided with a ground voltage terminal, and second ends of the plurality of leading-out wires are at the edge of the second substrate base and are electrically coupled to the ground voltage terminal.

In some embodiments, the plurality of leading-out wires are in the second conductive pattern layer.

In some embodiments, the second substrate base includes: a display sub-region and a bonding sub-region, the plurality of connection terminals include: multiple first connection terminals and multiple second connection terminals, the multiple first connection terminals are in the display sub-region and used for fixing pins of a pixel driving chip respectively, and the multiple second connection terminals are used for fixing a plurality of conductive pins, which are coupled to each of the plurality of signal lines, of a flexible circuit board in the bonding sub-region; and at least one of the multiple first connection terminals and/or at least one of the multiple second connection terminals are/is coupled to at least one of the plurality of leading-out wires.

In some embodiments, the plurality of leading-out wires are respectively directly coupled to corresponding connection terminals or are respectively coupled to the corresponding connection terminals through conductive structures which are in the second conductive pattern layer, and the plurality of leading-out wires do not overlap with the plurality of signal lines in a direction perpendicular to the second substrate base.

In some embodiments, the plurality of leading-out wires has a line width in a range from 50 um to 200 um in a direction parallel to the second substrate base.

In some embodiments, the plurality of leading-out wires has a line width of 100 um.

In some embodiments, the driving substrate further includes: at least one second insulating layer on a side of the second conductive pattern layer distal to the second substrate base; and vias in the at least one second insulating layer at positions corresponding to where the plurality of connection terminals and the plurality of detection terminals are located, respectively, to expose the plurality of connection terminals and the plurality of detection terminals.

According to one aspect of the present disclosure, a display device is provided. The display device includes: a driving substrate of claim 11 and a driving circuit for driving the driving substrate.

According to one aspect of the present disclosure, a method for manufacturing the above substrate motherboard of claim 1 is provided. The method includes: providing a first substrate base, wherein the first substrate base includes an active region for a driving substrate and a non-active region surrounding the active region; forming a first conductive pattern layer on the first substrate base such that the first conductive pattern layer includes a plurality of signal lines in the active region; forming at least one first insulating layer on a side of the first conductive pattern layer distal to the first substrate base; and forming a second conductive pattern layer on a side of the at least one first insulating layer distal to the first substrate base such that the second conductive pattern layer includes a plurality of connection terminals in the active region, a plurality of leading-out wires, and a plurality of detection terminals, the plurality of connection terminals are electrically coupled to corresponding signal lines of the plurality of signal lines, the plurality of detection terminals are in the non-active region, first ends of the plurality of leading-out wires are respectively electrically coupled to at least one of the plurality of connection terminals, and the plurality of leading-out wires extend to the non-active region to be electrically coupled to corresponding detection terminals through second ends of the plurality of leading-out wires, wherein the forming a second conductive pattern layer on a side of the at least one first insulating layer distal to the first substrate base includes: forming a second conductive material film; and performing a patterning process on the second conductive material film to form patterns of the plurality of connection terminals, the plurality of leading-out wires and the plurality of detection terminals.

DETAILED DESCRIPTION

In order to make those skilled in the art better understand the technical solution of the present disclosure, a substrate motherboard and a manufacturing method thereof, a driving substrate and a display device provided in the present disclosure are described in detail below with reference to the accompanying drawings.

When a substrate motherboard is being tested, probes of a testing instrument need to be in contact with corresponding connection terminals on the substrate motherboard. In the actual testing process, the size of the connection terminals is reduced along with high resolution of products, and the alignment and contact of the probes with the connection terminals become very difficult. In addition, the probes tend to scratch the connection terminals in the process of contacting with the connection terminals.

Figure 1:
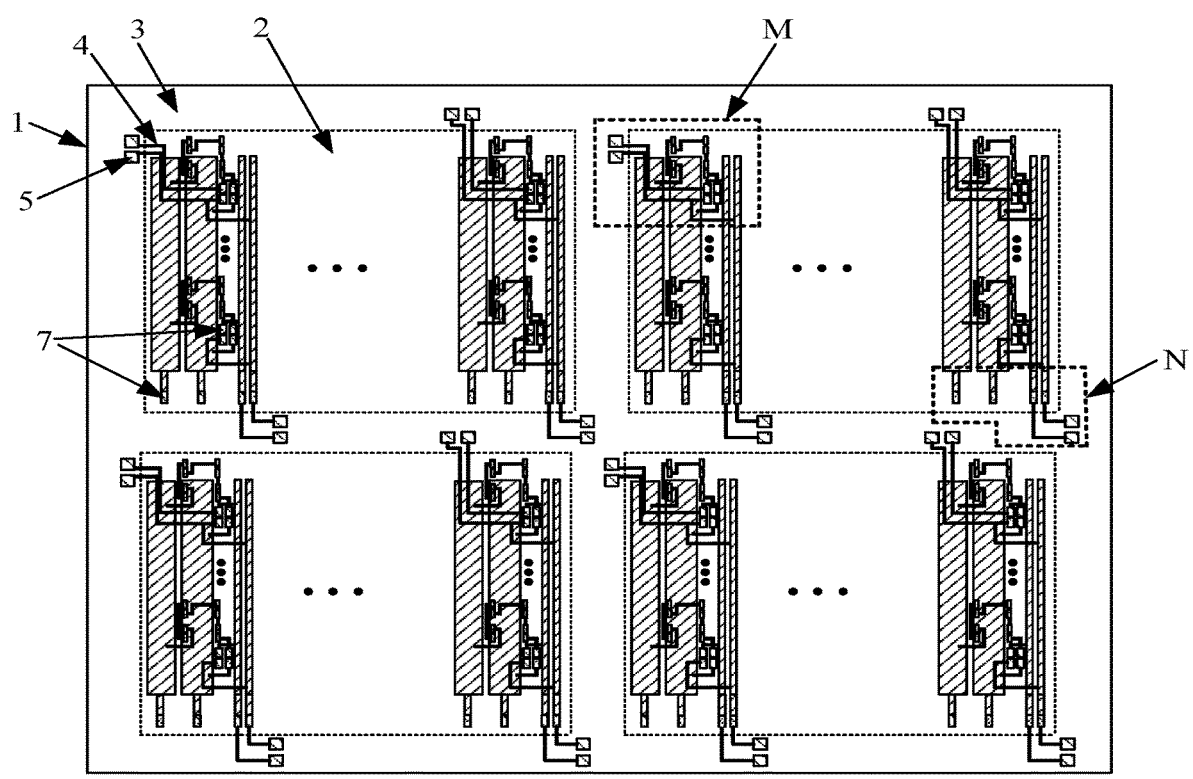
FIG. 1 is a schematic top view of a substrate motherboard according to an embodiment of the present disclosure.
Figure 2:
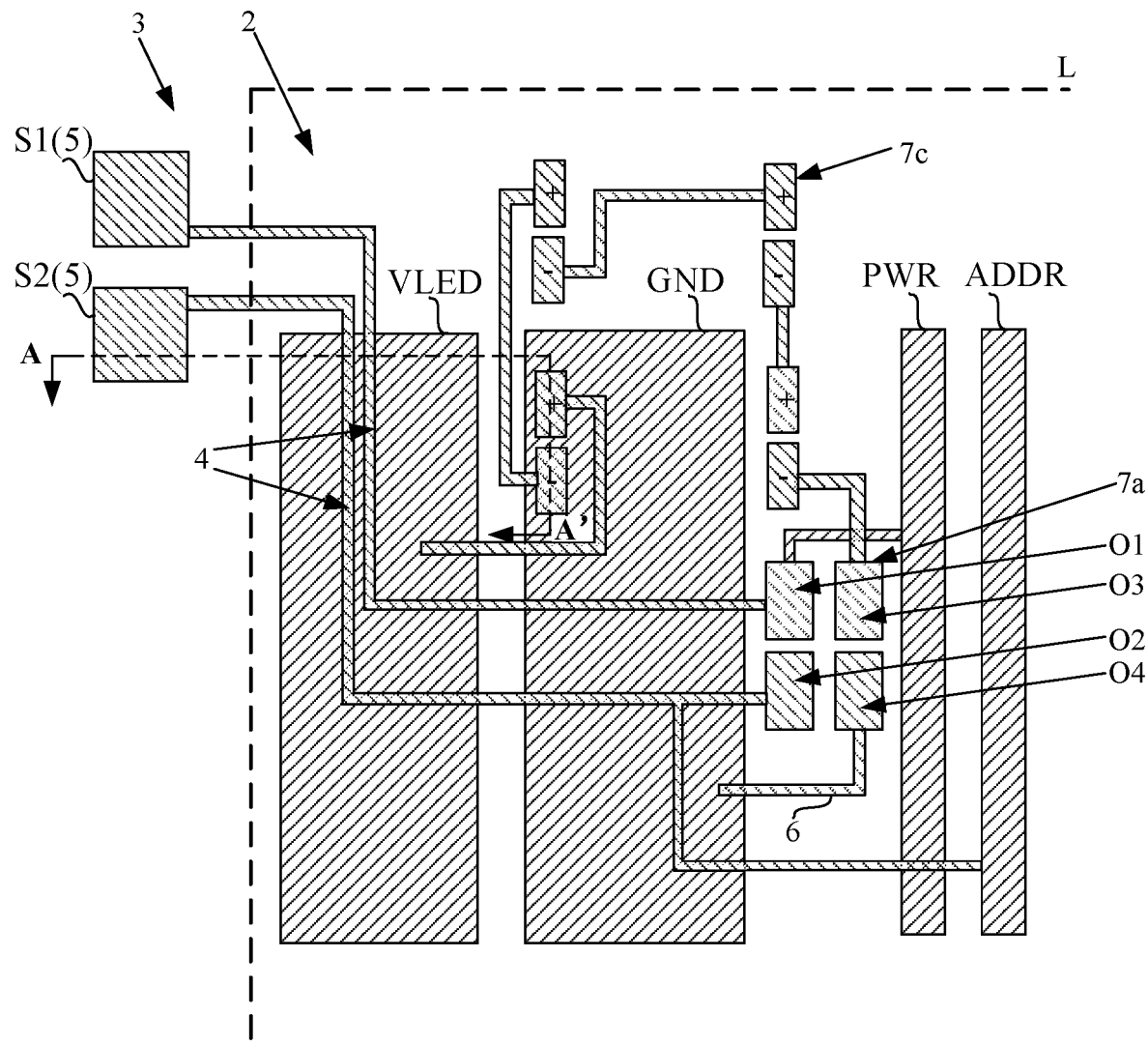
FIG. 2 is a zoom-in view of a region M in FIG. 1.
Figure 3:
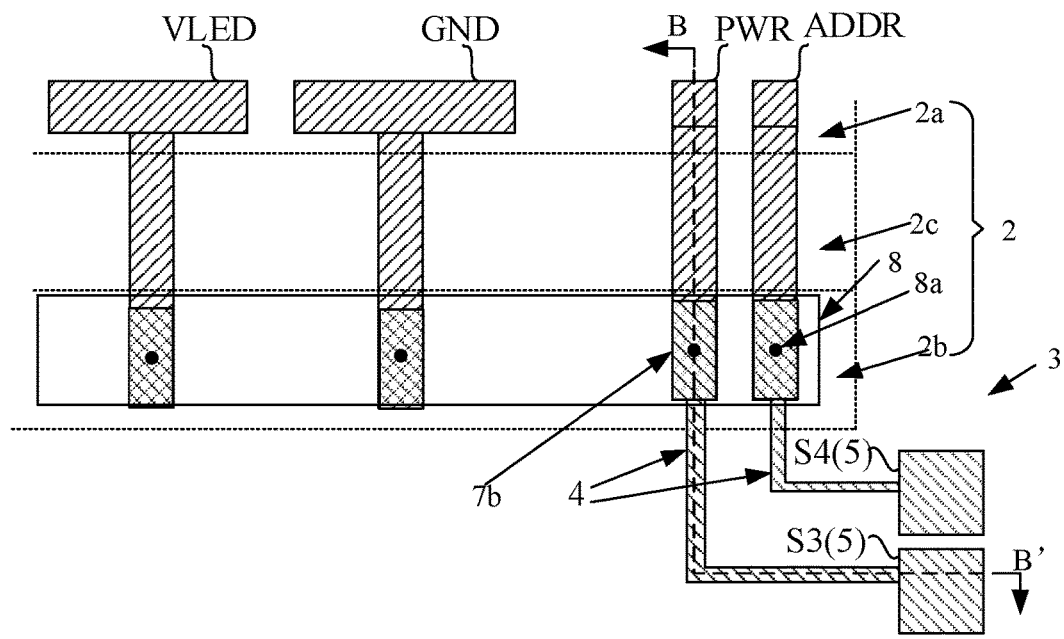
FIG. 3 is a zoom-in view of a region N in FIG. 1.
Figure 4:
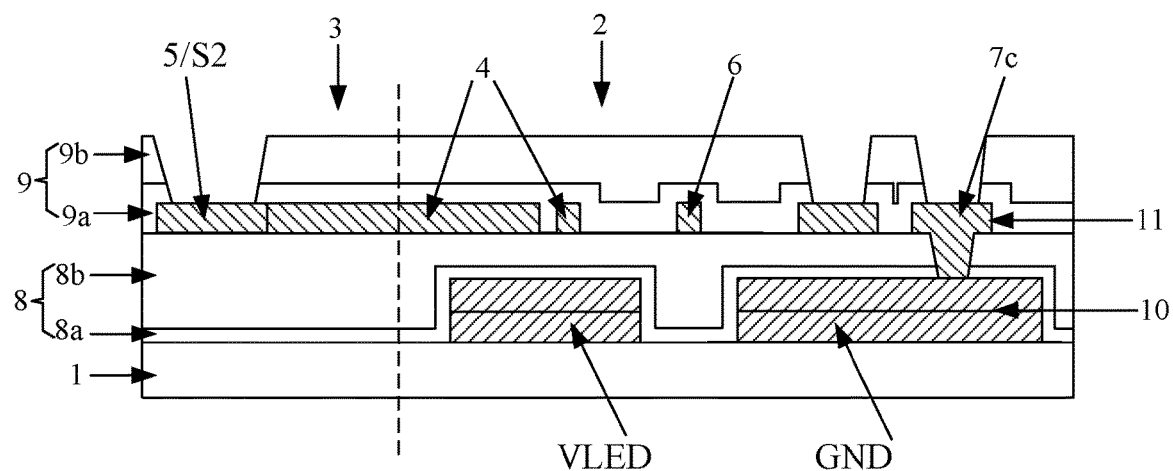
FIG. 4 is a schematic cross-sectional view taken along line A-A' in FIG. 2.
Figure 5:
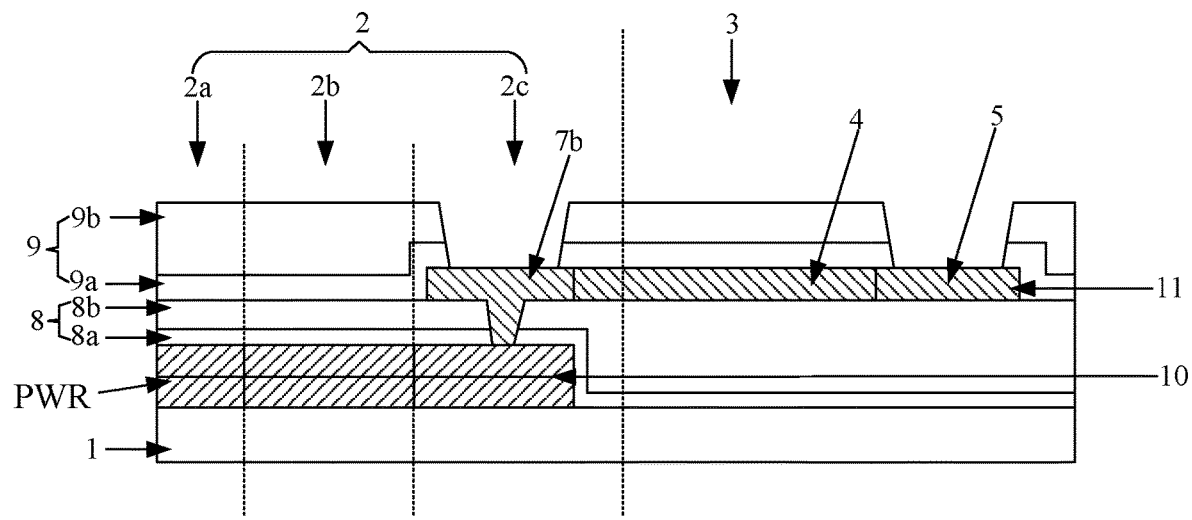
FIG. 5 is a schematic cross-sectional view taken along line B-B' in FIG. 3.

Thus, according to one aspect of the present disclosure, a substrate motherboard having a detection function is provided. FIG. 1 is a schematic top view of a substrate motherboard according to an embodiment of the present disclosure, FIG. 2 is a zoom-in view of a region M in FIG. 1, FIG. 3 is a zoom-in view of a region N in FIG. 1, FIG. 4 is a schematic cross-sectional view taken along line A-A' in FIG. 2, and FIG. 5 is a schematic cross-sectional view taken along line B-B' in FIG. 3. As shown in FIGS. 1 to 5, the substrate motherboard includes: a first substrate base 1, a first conductive pattern layer 10, at least one first insulating layer 8 and a second conductive pattern layer 11.

The first substrate base 1 is divided into an active region 2 for a driving substrate and a non-active region 3 surrounding the active region 2. The first conductive pattern layer 10 is on the first substrate base 1, and includes: a plurality of signal lines in the active region 2. The at least one first insulating layer 8 is on a side of the first conductive pattern layer 10 distal to the first substrate base 1. The second conductive pattern layer 11 is on a side of the at least one first insulating layer 8 distal to the first substrate base 1, and includes a plurality of connection terminals 7 in the active region 2. The connection terminals 7 are electrically coupled to corresponding signal lines. The substrate motherboard 1 further includes a plurality of leading-out wires and a plurality of detection terminals, and each of the plurality of connection terminals 7 is provided with a corresponding leading-out wire 4 and a detection terminal 5. The plurality of detection terminals 5 are in the non-active region 3. First ends of the plurality of leading-out wires 4 are electrically coupled to corresponding connection terminals 7 of the plurality of connection terminals, respectively, and the plurality of leading-out wires 4 extend to the non-active region 3 to be electrically coupled to corresponding detection terminals 5 through second ends of the plurality of leading-out wires 4.

In the embodiment of the present disclosure, active regions 2 on the substrate motherboard are regions in each of which a single driving substrate is formed. Each of the active regions 2 includes: a display sub-region 2a and a bonding sub-region 2b. The non-active region 3 on the substrate motherboard is a region where a subsequent cutting is performed. After the cutting is completed, the structures in each of the active regions 2 may be used as a driving substrate. Generally, a wiring concentrated sub-region 2c (also referred to as a Fan-Out region) for routing is between the display sub-region 2a and the bonding sub-region 2b. Wires in the wiring concentrated sub-region 2c electrically connects the signal lines in the display sub-region 2a with the connection terminals 7 in the bonding sub-region 2b.

The case of four active regions 2 on the substrate motherboard is merely exemplarily shown in FIG. 1 for illustrative purposes, and does not limit the technical solution of the present disclosure.

Referring to FIGS. 4 and 5, in some embodiments, a material of the first conductive pattern layer 10 includes a metal material, such as copper. Considering that the signal lines in the first conductive pattern layer 10 have a long length and a large resistance, the signal lines are designed to have a large thickness (generally more than 2 um) in order to reduce the overall resistance of the signal lines. Exemplarily, the signal lines in the first conductive pattern layer 10 are of a double-layer structure, and a material of the signal lines includes copper.

In some embodiments, each of the at least one first insulating layer 8 includes: a first passivation layer 8a and a first planarization layer 8b. The first passivation layer 8a is on a side of the first conductive pattern layer 10 distal to the first substrate base 1, and the first planarization layer 8b is on a side of the first passivation layer 8a distal to the first substrate base 1.

In some embodiments, a material of the second conductive pattern layer 11 includes a metal material, such as copper. It should be noted that, in general, the second conductive pattern layer includes not only the connection terminals 7 but also some connection lines 6. These connection terminals 7 may be divided into a plurality of first connection terminals 7a, a plurality of second connection terminals 7b and a plurality of third connection terminals 7c.

Figure 11:
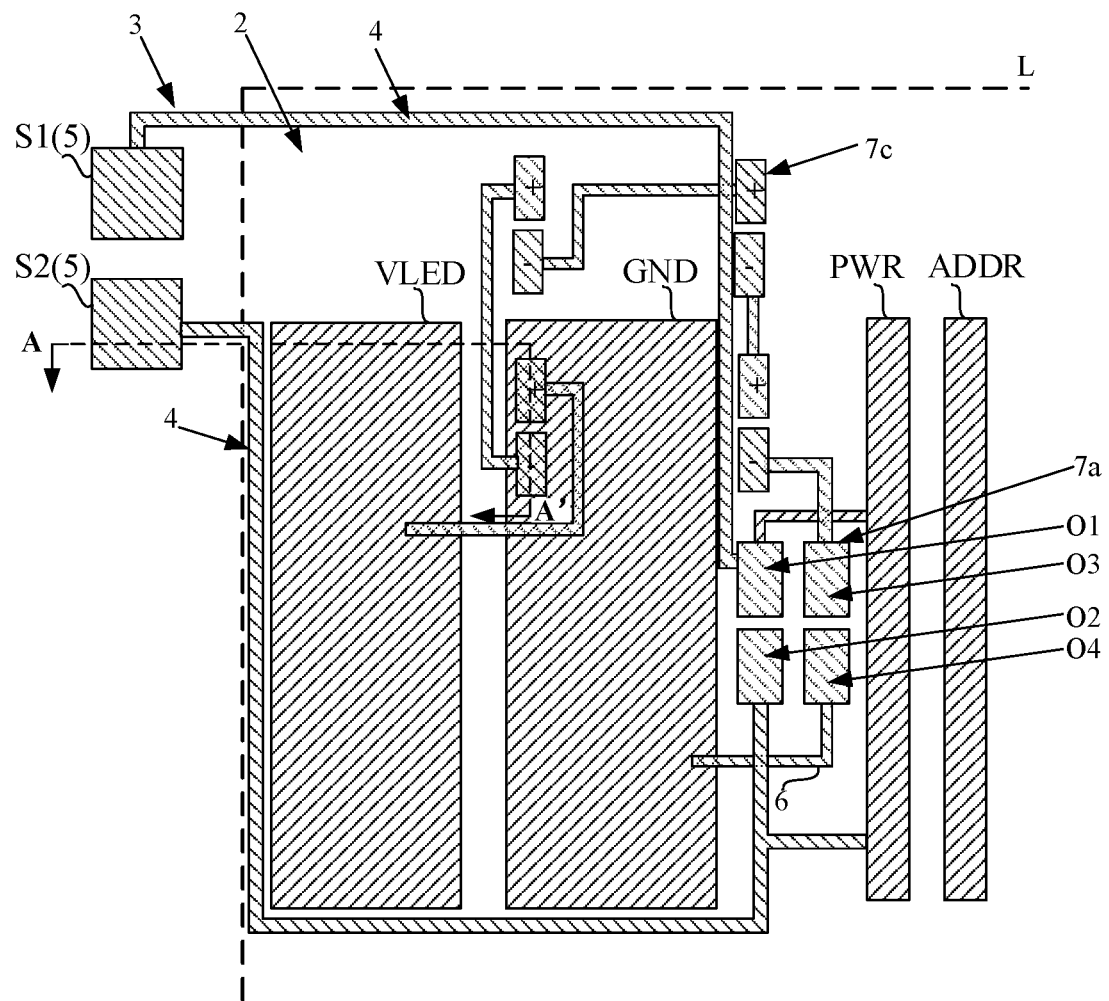
FIG. 11 is a zoom-in view of a partial region of a substrate motherboard according to an embodiment of the present disclosure.

The plurality of first connection terminals 7a are in the display sub-region 2a and used for being fixedly coupled to pins of a pixel driving chip. The plurality of second connection terminals 7b are used for being fixedly coupled to conductive pins 8a of a flexible circuit board 8 in the bonding sub-region 2b. The plurality of third connection terminals 7c are in the display sub-region 2a and used for being fixedly coupled to pins of a LED chip. The plurality of leading-out wires 4 may be in the second conductive pattern layer 11, and the plurality of detection terminals 5 may also be in the second conductive pattern layer 11. Also, as shown in FIG. 11, the plurality of leading-out wires 4 may not overlap with the plurality of signal lines in a direction perpendicular to the first substrate base to reduce parasitic capacitance.

In some embodiments, at least one second insulating layer 9 is provided on a side of the second conductive pattern layer 11 distal to the first substrate base 1. Each of the at least one second insulating layer 9 is provided with corresponding vias at positions corresponding to where the connection terminals 7 and the detection terminals 5 are located along a direction perpendicular the first substrate base 1. The vias extend to corresponding connection terminals 7 and corresponding detection terminals 5 so as to expose the connection terminals 7 and the detection terminals 5.

In some embodiments, the second insulating layer 9 includes a second passivation layer 9a and a second planarization layer 9b. The second passivation layer 9a is on a side of the second conductive pattern layer 10 distal to the first substrate base 1, and the second planarization layer 9b is on a side of the second passivation layer 9a distal to the first substrate base 1.

In the embodiment of the present disclosure, the connection terminal 7 provided with the corresponding leading-out wire 4 and the detection terminal 5, may be used as a connection terminal for contacting with a probe of a test instrument in an existing test item. Generally, a connection terminal is in contact with a different probe of a test instrument in different test items. Therefore, in practical applications, the connection terminals 7 provided with the leading-out wires 4 and the detection terminals 5 may be determined according to actual test requirements.

In the related art, when a certain signal line is subjected to an open and short circuit test, two connection terminals coupled to the signal line and having the farthest distance therebetween are often selected for the test. Whether the signal line is open or short is determined by judging the resistance between the two connection terminals. The specific testing process belongs to the conventional technology in the art, and is not described herein again. In the embodiment of the present disclosure, the two connection terminals 7 coupled to a same signal lines and having the farthest distance therebetween may be respectively provided with corresponding leading-out wires 4 and corresponding detection terminals 5.

Figure 6:
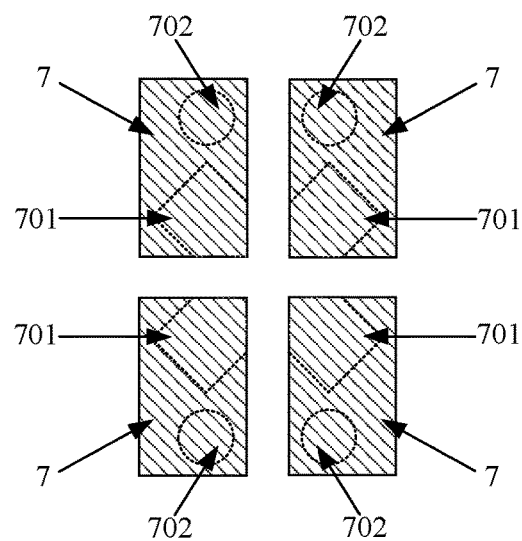
FIG. 6 is a schematic view illustrating contact positions of probes in performing an open and short circuit test in the related art.

FIG. 6 is a schematic view illustrating contact positions of probes in performing an open and short circuit test in the related art. As shown in FIG. 6, in the related art, in order to perform the open and short circuit test, vias 702 for performing the open and short circuit test are newly provided in regions on the connection terminals 7 other than real connection regions 701. By placing the probes in the vias 702 for the open and short circuit test, the probes are in contact with the connection terminals 7. The real connection regions 701 refer to regions where the connection terminals 7 are in direct contact with the signal lines through the vias or directly overlap with the signal lines. As the size of the connection terminal 7 becomes smaller, the region for the via 702 for the open and short circuit test becomes smaller, and it becomes very difficult to align and contact the probe with the connection terminal 7. In addition, the connection terminal 7 is easily scratched while the probe is in contact with the connection terminal 7.

Unlike the related art, in the embodiment of the present disclosure, when the substrate motherboard is tested, probes of a test instrument are no longer in contact with one or more of the connection terminals 7, but are in contact with the detection terminals 5 coupled to to the one or more of the connection terminals 7, so that the probes can be prevented from scratching the connection terminals 7. Meanwhile, since the detection terminals 5 are in the non-active region 3, the size of the detection terminals 5 is not affected by the resolution of a product and can be larger than that of the connection terminals 7, thereby facilitating alignment and contact with the probes.

In some embodiments, the detection terminal 5 has a shape of a rectangle, with a length ranging from 0.4 mm to 1.0 mm and a width ranging from 0.2 mm to 1.0 mm. It is to be noted, the technical solution of the present disclosure does not limit the shape, the size, and the positions of the detection terminals 5 in the non-active region 3.

In some embodiments, the leading-out wires 4 and/or the detection terminals 5 are in the second conductive pattern layer 11. That is, the leading-out wires 4 and/or the detection terminals 5 are in a same layer as the connection terminals 7. The leading-out wires 4 and/or the detection terminals 5 may be manufactured in manufacturing the second conductive pattern layer 11, and thus, additional processes for manufacturing the leading-out wires 4 and the detection terminals 5 are omitted. Of course, the leading-out wires 4 and/or the detection terminals 5 may be in a different layer from the connection terminals 7, and separate additional processes for manufacturing the leading-out wires 4 and the detection terminals 5 may be provided.

Parasitic capacitance may exist between the leading-out wires 4 and the signal lines in the active region. The wider the line width of the leading-out wires 4 is, the larger the parasitic capacitance between the leading-out wires 4 and the signal lines is, and the larger the interference of the leading-out wires 4 on the signal on the signal lines is. In addition, the narrower the line width of the leading-out wires 4 is, the greater the resistance of the leading-out wires is, which is disadvantageous for signal testing. Based on the above two factors, in a case where the parasitic capacitance is ensured to be small, and the signal testing is ensured to be performed, in some embodiments, the line width of the leading-out wires 4 may be selected in a range from 50 um to 200 um. Optionally, the leading-out wires 4 has a line width of 100 um.

In some embodiments, the connection terminals 7 provided with the leading-out wires 4 include: at least one first connection terminal 7a and/or at least one second connection terminal 7b.

Taking FIGS. 2 and 3 as an example, one pixel includes four LED chips and one pixel driving chip, and the pixel driving chip is used for driving a plurality of LED chips in a same pixel. For each of a plurality of pixels, one corresponding driving region at least exists on the driving substrate. Each of driving regions requires to be provided with eight third connection terminals 7c (four pairs of connection terminals including positive (+) and negative (−) connection terminals, corresponding to four LED chips, and each of the four LED chips having two pins) and four first connection terminals 7a (corresponding to four pins of one pixel driving chip).

In a specific example, the signal lines in the first conductive pattern layer 10 include: a LED voltage supply line VLED, a ground voltage supply line GND, an operation indication signal line PWR, and an address signal line ADDR. The four first connection terminals 7a includes: a first chip connection terminal O1, a second chip connection terminal O2, a third chip connection terminal O3, and a fourth chip connection terminal O4. The first chip connection terminal O1 is coupled to the operation indication signal line PWR through a via, the second chip connection terminal O2 is coupled to the address signal line ADDR through a connection line 6, the third chip connection terminal O3 is coupled to a negative (−) connection terminal through a connection line 6, and the fourth chip connection terminal O4 is coupled to the ground voltage supply line GND through a connection line 6. The LED voltage supply line VLED is coupled to a positive (+) connection terminal through a connection line 6.

Continuing to refer to FIGS. 2 and 3, in some embodiments, taking a case where an open and short circuit test is performed on one operation indication signal line PWR and one address signal line ADDR as an example, the connection terminals provided with the leading-out wires 4 and the detection terminals 5 may include: the first chip connection terminal O1 electrically coupled to the operation indication signal line PWR to be tested and corresponding to a first row of pixels, the first chip connection terminal O1 electrically coupled to the address signal line ADDR to be tested and corresponding to the first row of pixels, the second connection terminal 7b electrically coupled to the operation indication signal line PWR to be tested, and the second connection terminal 7b electrically coupled to the address signal line ADDR to be tested.

Referring to FIG. 2, the first chip connection terminal O1 is led out to the non-active region 3 through one leading-out wire 4 and coupled to one detection terminal S1 in the non-active region 3, and the second chip connection terminal O2 is led out to the non-active region 3 through one leading-out wire 4 and coupled to one detection terminal S2 in the non-active region 3. The leading-out wire 4 corresponding to the first chip connection terminal O1 is directly coupled to the first chip connection terminal O1, and the leading-out wire 4 corresponding to the second chip connection terminal O2 is directly coupled to one connection line 6 (i.e., a conductive structure coupled to the detection terminal 5) which is coupled to the second chip connection terminal O2.

Referring to FIG. 3, the second connection terminal 7b electrically coupled to the operation instruction signal line PWR to be tested is led out to the non-active region 3 through one leading-out wire 4 and is coupled to one detection terminal S3 in the non-active region 3, and the second connection terminal 7b electrically coupled to the address signal line ADDR to be tested is led out to the non-active region 3 through one leading-out wiring 4 and is coupled to one detection terminal S4 in the non-active region 3.

When the open and short circuit test is performed on the operation indication signal line PWR, two probes of a test instrument may be in contact with the detection terminal S1 and the detection terminal S3, respectively. When the open and short circuit test is performed on the address signal lines ADDR, two probes of the test instrument may be in contact with the detection terminal S2 and the detection terminal S4, respectively.

It should be noted that, when the open and short circuit test is performed on a certain signal line, each of the connection terminals 7a may be provided with a corresponding leading-out wire 4 and a corresponding detection terminal 5. In this case, the open and short circuit test may be performed on the signal line in section.

Figure 7:
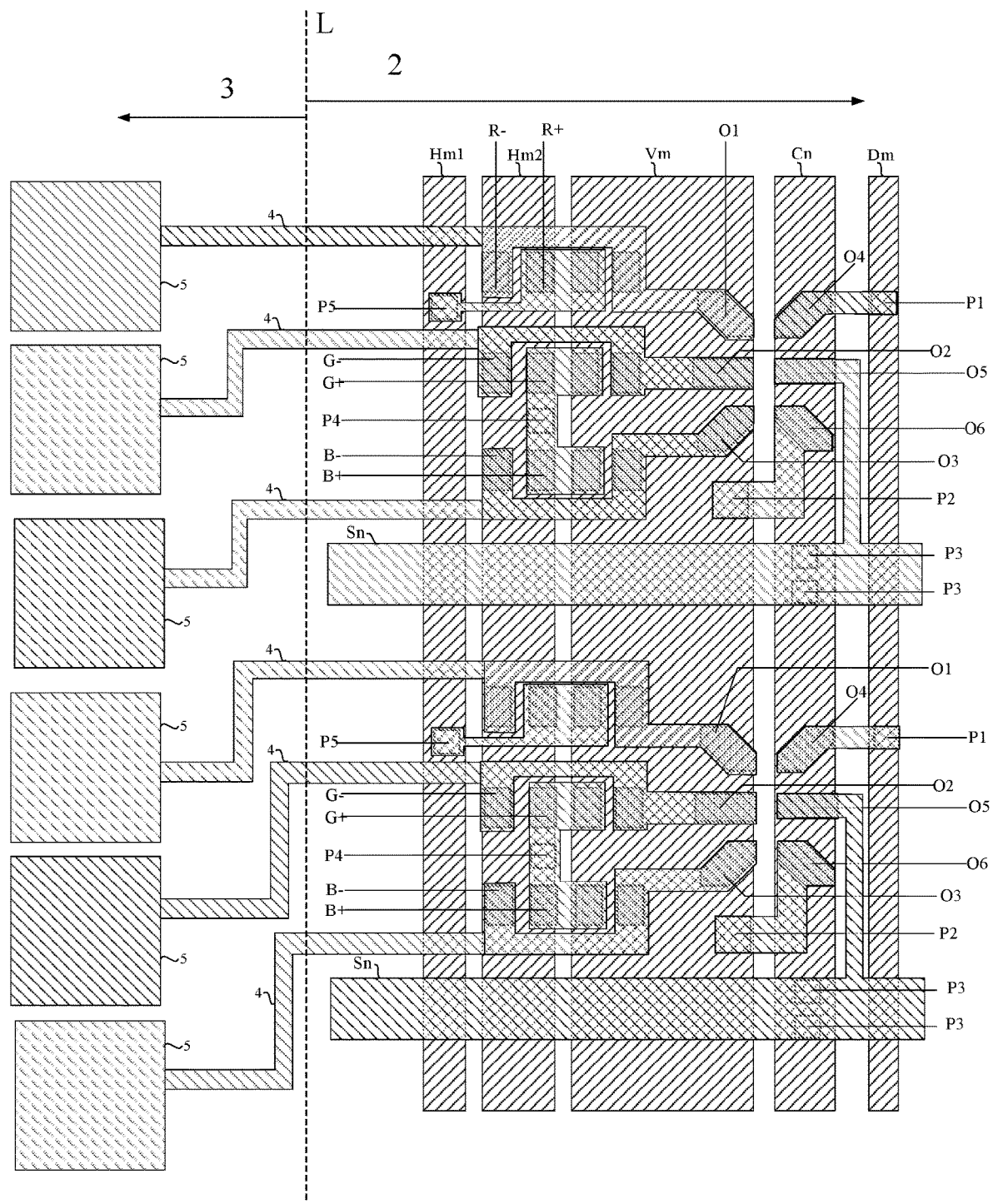
FIG. 7 is a schematic top view of an upper region of a substrate motherboard according to an embodiment of the present disclosure.

FIG. 7 is a schematic top view of an upper region of a substrate motherboard according to an embodiment of the present disclosure. As shown in FIG. 7, unlike the substrate motherboard shown in FIG. 1, each of driving regions on the substrate motherboard shown in FIG. 7 is provided with six third connection terminals (three pairs connection terminals including positive (+) and negative (−), corresponding to three LED chips, and each of the three LED chips having two pins) and six first connection terminals (corresponding to one pixel driving chip having six pins).

The signal lines in the first conductive pattern layer includes: a scan signal supply line Cn, a data line Dm, positive electrode signal lines Hm1 and Hm2, and a reference signal line Vm. The connection lines 6 in the second conductive pattern layer includes: a scan line Sn. The scanning signal supply line Cn is electrically coupled to the scanning line Sn and is used for providing scanning signals for the scanning line Sn. The data line is used for providing data signals. The reference signal line is used for providing negative signals. The positive signal lines are used for providing positive signals.

Taking the FIG. 7 as an example, one pixel includes three different color subpixels and one pixel driving chip, and one subpixel includes at least one LED chip (not shown). The three different color subpixels are provided with six third connection terminals: a first color subpixel negative electrode connection terminal R−, a first color subpixel positive electrode connection terminal R+, a second color subpixel negative electrode connection terminal B−, a second color subpixel positive electrode connection terminal B+, a third color subpixel negative electrode connection terminal G−, and a third color subpixel positive electrode connection terminal G+.

The one pixel driving chip has six pins, and accordingly, a LED display substrate needs to be provided with six first connection terminals: a first chip connection terminal O1, a second chip connection terminal O2, a third chip connection terminal O3, a fourth chip connection terminal O4, a fifth chip connection terminal O5, and a sixth chip connection terminal O6.

The first chip connection terminal O1 is coupled to the first color subpixel negative electrode connection terminal R−, the second chip connection terminal O2 is coupled to the third color subpixel negative electrode connection terminal G−, the third chip connection terminal O3 is coupled to the second color subpixel negative electrode connection terminal B−, the fourth chip connection terminal O4 is coupled to the scanning line Sn, the fifth chip connection terminal O5 is coupled to the data line Dn through a via P1, and the sixth chip connection terminal O6 is coupled to the reference signal line Vm through a via P2. The first color subpixel positive electrode connection terminal R+ is coupled to the positive electrode signal line Hm1 through a via P5, the third color subpixel positive electrode connection terminal G+ is coupled to the positive electrode signal line Hm2 through a via P4, and the second color subpixel positive electrode connection terminal B+ is coupled to the positive electrode signal line Hm2 through a via P4.

The pixel driving chip is used for writing the data signals provided by the data lines Dm into the subpixels of different colors in a time-sharing manner under the control of the scanning signals provided by the scanning line Sn. The reference signal line Vm is used for providing a negative signal to the pixel driving chip, so that a current path is formed between the pixel driving chip and a light emitting diode.

In some embodiments, the first chip connection terminal O1, the second chip connection terminal O2, and the third chip connection terminal O3 each are provided with a corresponding leading-out wire 4 and a corresponding detection terminal 5. The positions of the leading-out wires 4 and the detection terminals 5 are not limited in the technical solution of the present disclosure.

Figure 8:
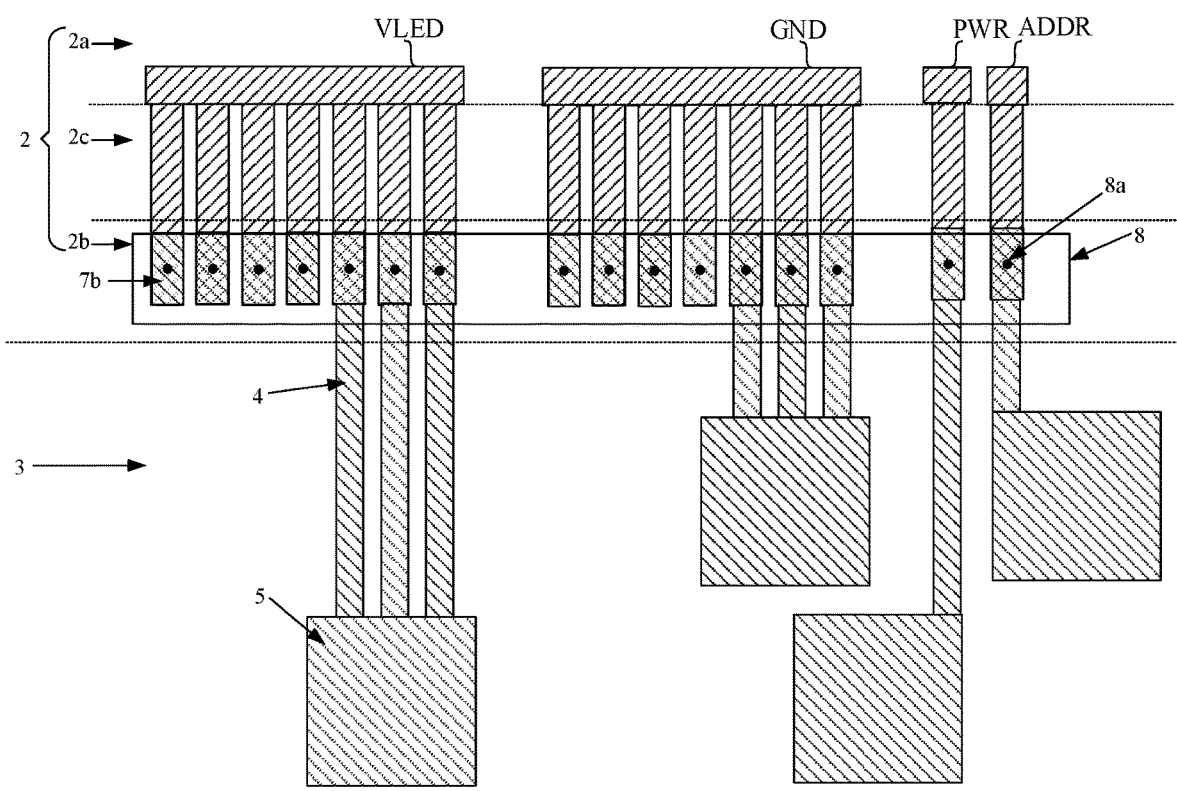
FIG. 8 is a schematic top view of an upper region of a substrate motherboard according to an embodiment of the present disclosure.

FIG. 8 is a schematic top view of an upper region of a substrate motherboard according to an embodiment of the present disclosure. As shown in FIG. 8, in the embodiment of the present disclosure, each of the detection terminals 5 may be coupled to corresponding one or more leading-out wires 4.

As shown in FIG. 8, some of the signal lines are electrically coupled to the plurality of second connection terminals 7b. Exemplary, the ground voltage supply line GND is coupled to a large load, and a plurality of connection terminals are required simultaneously to write a ground voltage to one ground voltage supply line GND, that is, one ground voltage supply line GND is electrically coupled to a plurality of second connection terminals 7b in the bonding sub-region 2b. FIG. 8 illustrates, for example, that: one ground voltage supply line GND is electrically coupled to seven second connection terminals 7b in the bonding sub-region 2b, one LED voltage supply line VLED is electrically coupled to seven second connection terminals 7b in the bonding sub-region 2b, one operation indication signal line PWR is electrically coupled to one second connection terminal 7b in the bonding sub-region 2b, and one address signal line ADDR is electrically coupled to one second connection terminal 7b in the bonding sub-region 2b.

Three second connection terminals 7b electrically coupled to a same ground voltage supply line GND are provided with three leading-out wires which are coupled to a same detection terminal 5 in the non-active region 3. Three second connection terminals 7b electrically coupled to a same LED voltage supply line VLED are provided with three leading-out wires which are coupled to a same detection terminal 5 in the non-active region 3. One second connection terminal 7b electrically coupled to the operation indication signal line PWR is provided with one leading-out wire which is coupled to one detection terminal 5 in the non-active region 3. One second connection terminal 7b electrically coupled to the address signal line ADDR is provided with one leading-out wire which is coupled to one detection terminal 5 in the non-active region 3. That is, eight different connection terminals correspond to eight different leading-out wires and four different detection terminals 5. Optionally, all the second connection terminals coupled to the signal line may be coupled to a same detection terminal through the leading-out wires.

The present disclosure further provides a driving substrate, which is in the active region of the above substrate motherboard. That is, the driving substrate may be obtained by cutting the above substrate motherboard along cutting lines (for example, a dotted line L in FIGS. 2 and 7) in the non-active region. Since the detection terminals are in the non-active region, a portion of the leading-out wires may be left on the driving substrate after cutting, but no detection terminal exists. It is understood that, in order to reduce the risk of introducing static charges due to floating of an end of the leading-out wires left on the driving substrate after cutting, the floating end (as a second end) may be coupled to a ground voltage terminal through a conductive structure (e.g., a conductive tape, a silver paste, an electrostatic ring, etc.) in a peripheral region of the display device.

Specifically, the driving substrate includes: a second substrate base, a first conductive pattern layer, at least one first insulating layer and a second conductive pattern layer. The first conductive pattern layer is on the second substrate base, and includes: a plurality of signal lines in the active region. The at least one first insulating layer is on a side of the first conductive pattern layer distal to the second substrate base. The second conductive pattern layer is on a side of the at least one first insulating layer distal to the second substrate base and includes a plurality of connection terminals, and some of the plurality of connection terminals are coupled to corresponding signal lines through vias. The driving substrate further includes a plurality of leading-out wires. First ends of the leading-out wires are respectively electrically coupled to corresponding connection terminals, and the leading-out wires extend to an edge of the second substrate base.

In some embodiments, the plurality of leading-out wires are in the second conductive pattern layer.

In some embodiments, the second substrate base includes: a display sub-region and a bonding sub-region. The plurality of connection terminals include multiple first connection terminals and multiple second connection terminals. The multiple first connection terminals are in the display sub-region and are used for fixing pins of a pixel driving chip respectively, and the multiple second connection terminals are used for fixing a plurality of conductive pins, which are coupled to each of the plurality of signal lines, of a flexible circuit board in the bonding sub-region. And, at least one of the multiple first connection terminals and/or at least one of the multiple second connection terminals are/is coupled to at least one of the plurality of leading-out wires.

In some embodiments, the plurality of leading-out wires are directly coupled to corresponding connection terminals, respectively; or the plurality of leading-out wires are respectively coupled to corresponding connection terminals through conductive structures which are in the second conductive pattern layer. And, the plurality of leading-out wires and the plurality of signal lines are not overlapped with each other in the direction perpendicular to the second substrate base.

In some embodiments, a line width of the plurality of leading-out wires in a direction parallel to the second substrate base is in a range from 50 um to 200 um. And optionally, the line width of the plurality of leading-out wires is 100 um.

In some embodiments, the driving substrate further includes: at least one second insulating layer on a side of the second conductive pattern layer distal to the second substrate base. Corresponding vias are respectively provided in the at least one second insulating layer at positions corresponding to the plurality of connection terminals along the direction perpendicular to the second substrate base so as to expose the corresponding connection terminals.

For the detailed description of the structures in the driving substrate, reference may be made to the portions in the active region 2 in FIG. 1 and the corresponding contents in the foregoing embodiments and the detailed description are not repeated herein.

Figure 9:
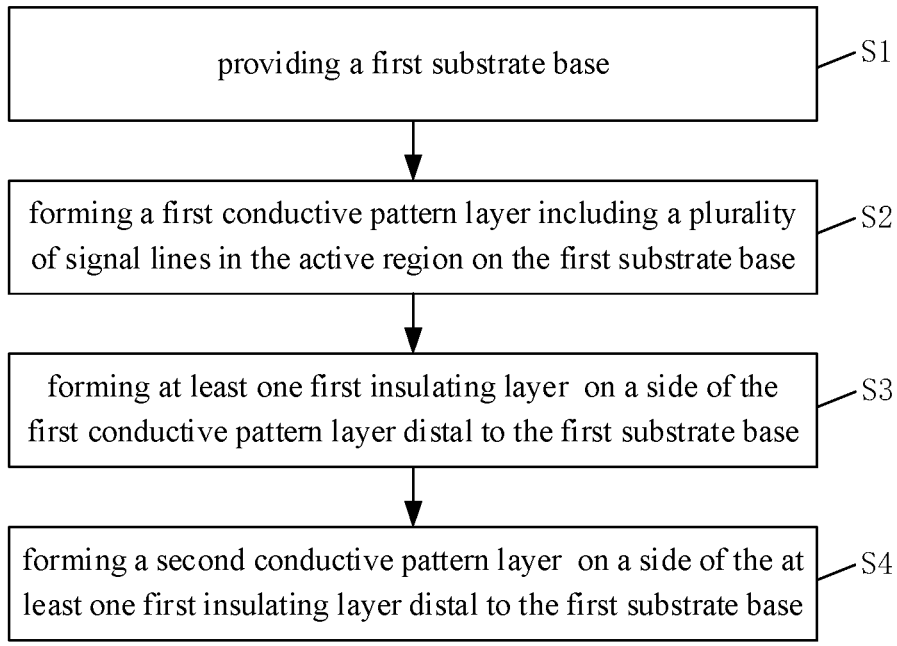
FIG. 9 is a flowchart illustrating a method for manufacturing a substrate motherboard according to an embodiment of the present disclosure.

The present disclosure further provides a method for manufacturing the substrate motherboard. FIG. 9 is a flowchart illustrating a method for manufacturing a substrate motherboard according to an embodiment of the present disclosure. As shown in FIG. 9, the manufacturing method may be used to manufacture the above substrate motherboard, and includes the following steps.

In step S1, a first substrate base is provided. The first substrate base is divided into an active region for a driving substrate base and a non-active region surrounding the active region.

In step S2, a first conductive pattern layer is formed on the first substrate base. The first conductive pattern layer includes: a plurality of signal lines in the active region.

In step S3, at least one first insulating layer is formed on a side of the first conductive pattern layer distal to the first substrate base.

In step S4, a second conductive pattern layer is formed on a side of the at least one first insulating layer distal to the first substrate base.

The second conductive pattern layer includes: a plurality of connection terminals in the active region respectively coupled to corresponding signal lines. At least one of the plurality of connection terminals is provided with a corresponding leading-out wire and a detection terminal. The plurality of detection terminals are in the non-active region, and first ends of the plurality of leading-out wires are electrically coupled to corresponding connection terminals and extend to the non-active region to be electrically coupled to corresponding detection terminals through second ends of the plurality of leading-out wires.

Figure 10:
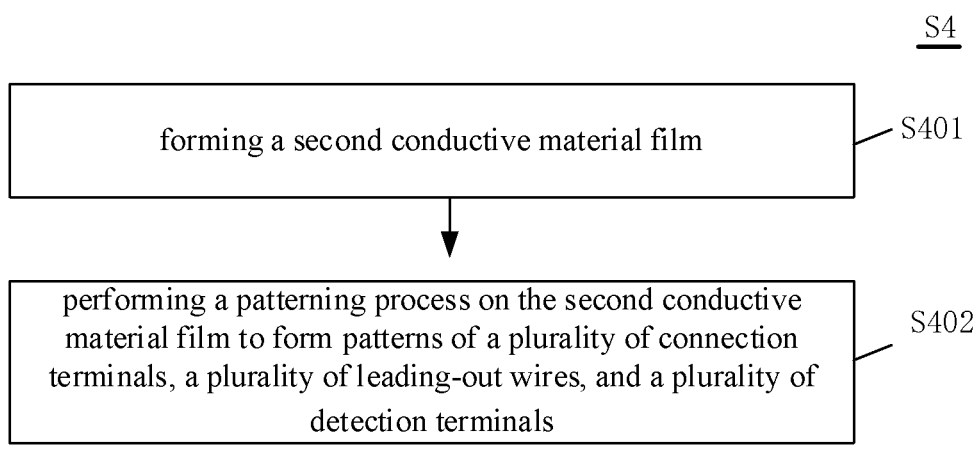
FIG. 10 is a flowchart illustrating a specific implementation method of step S4 in FIG. 9.

FIG. 10 is a flowchart illustrating a specific implementation method of step S4 in FIG. 9. As shown in FIG. 10, in some embodiments, the step S4 specifically includes the following steps.

In step S401, a second conductive material film is formed. The second conductive material may be a metal material, such as copper.

In step S402, a patterning process is performed on the second conductive material film to form patterns of a plurality of connection terminals, a plurality of leading-out wires, and a plurality of detection terminals.

When the step S4 includes the above step S401 and step S402, that is, the leading-out wires/detection terminals are formed in the same steps as the connection terminals. The leading-out wires and/or the detection terminals formed in step S4 are in the same layer as the connection terminals.

Of course, the leading-out wires and/or the detection terminals may be in a different layer from the connection terminals, and a separate process may be provided for the leading-out wires and the detection terminals. That is, the process of forming the leading-out wires and the detection terminals are independent of step S4 (not shown in the drawings).

Generally, after step S4, the method further includes: forming at least one second insulating layer on a side of the second conductive pattern layer distal to the second substrate base. At least one second insulating layer is provided with vias extending to the connection terminals and the detection terminals.

In some embodiments, after step S4, the method further includes: cutting the substrate motherboard along the non-active region to obtain the portion in the active region on the substrate motherboard. In this case, the portion of each of the active regions on the substrate motherboard may serve as a driving substrate.

An embodiment of the present disclosure further provides a display device including: a driving substrate and a driving circuit for driving the driving substrate in the above embodiments. The specific description of the structures of the driving substrate may refer to corresponding contents in the above embodiments, and will not be repeated herein.

In some embodiments, the display device further includes light emitting elements including: Micro-LED chips or Mini-LED chips.

In the embodiments of the present disclosure, the light emitting elements and the driving substrate may constitute a light source with other optical structures (e.g., a light guide plate, a diffusion sheet, etc.) to provide light to a display panel in a display device. Alternatively, the light emitting elements and the driving substrate may be part of a display panel in a display device, and may perform screen display directly.

In some embodiments, the display device may be any product or component having a display function, such as a mobile phone, a tablet computer, a television, a display, a notebook computer, a digital photo frame, a navigator, and the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

What is claimed is:

1. A substrate motherboard, comprising:
a first substrate base comprising an active region for a driving substrate and a non-active region surrounding the active region;
a first conductive pattern layer on the first substrate base, comprising a plurality of signal lines in the active region;
at least one first insulating layer on a side of the first conductive pattern layer distal to the first substrate base; and
a second conductive pattern layer on a side of the at least one first insulating layer distal to the first substrate base, comprising a plurality of connection terminals in the active region, wherein the plurality of connection terminals are electrically coupled to corresponding signal lines of the plurality of signal lines,
wherein the substrate motherboard further comprises a plurality of leading-out wires and a plurality of detection terminals, the plurality of detection terminals are in the non-active region, first ends of the plurality of leading-out wires are electrically coupled to at least one connection terminal of the plurality of connection terminals respectively, and the plurality of leading-out wires extend to the non-active region to be electrically coupled to corresponding detection terminals through second ends of the plurality of leading-out wires,
wherein the active region comprises: a display sub-region and a bonding sub-region,
the plurality of connection terminals comprise, multiple first connection terminals and multiple second connection terminals, the multiple first connection terminals are in the display sub-region and used for fixing pins of a pixel driving chip respectively, and the multiple second connection terminals are used for fixing a plurality of conductive pins, which are coupled to each of the plurality of signal lines, of a flexible circuit board in the bonding sub-region; and
at least one of the multiple first connection terminals and/or at least one of the multiple second connection terminals are/is couple to at least one of the plurality of leading-out wires.

2. The substrate motherboard of claim 1, wherein at least one of the multiple first connection terminals and at least one of the multiple second connection terminals each are coupled to one leading-out wire.

3. The substrate motherboard of claim 1, wherein multiple conductive pins of the plurality of conductive pins are coupled to a same signal line, a number of the multiple second connection terminals are respectively fixed with the multiple conductive pins of the plurality of conductive pins, and at least one of the number of the multiple second connection terminals is coupled to a same detection terminal through corresponding leading-out wires.

4. The substrate motherboard of claim 1, wherein the plurality of leading-out wires are in the second conductive pattern layer; and/or
the plurality of detection terminals are in the second conductive pattern layer.

5. The substrate motherboard of claim 4, wherein the plurality of leading-out wires do not overlap with the plurality of signal lines in a direction perpendicular to the first substrate base.

6. The substrate motherboard of claim 1, wherein the plurality of leading-out wires are directly coupled to corresponding connection terminals, respectively; or
the plurality of leading-out wires are respectively coupled to the corresponding connection terminals through conductive structures which are in the second conductive pattern layer.

7. The substrate motherboard of claim 1, wherein the plurality of leading-out wires has a line width in a range from 50 um to 200 um in a direction parallel to the first substrate base.

8. The substrate motherboard of claim 7, wherein the plurality of leading-out wires has a line width of 100 um.

9. The substrate motherboard of claim 1, further comprising:
at least one second insulating layer on a side of the second conductive pattern layer distal to the first substrate base; and
vias are provided in the at least one second insulating layer at positions corresponding to where the plurality of connection terminals and the plurality of detection terminals are located, respectively, to expose the plurality of connection terminals and the plurality of detection terminals.

10. A driving substrate, comprising:
a second substrate base;
a first conductive pattern layer on the second substrate base, comprising a plurality of signal lines;
at least one first insulating layer on a side of the first conductive pattern layer distal to the second substrate base; and
a second conductive pattern layer on a side of the at least one first insulating layer distal to the second substrate base, comprising a plurality of connection terminals electrically coupled to corresponding signal lines of the plurality of signal lines;
wherein the driving substrate further comprises a plurality of leading-out wires, first ends of the plurality of leading-out wires are electrically coupled to at least one of the plurality of connection terminals respectively, and the plurality of leading-out wires extend to an edge of the second substrate base;

wherein the edge of the second substrate base is provided with a ground voltage terminal, and second ends of the plurality of leading-out wires are at the edge of the second substrate base and are electrically coupled to the ground voltage terminal, and wherein the second substrate base comprises: a display sub-region and a bonding sub-region, the plurality of connection terminals comprise, multiple first connection terminals and multiple second connection terminals, the multiple first connection terminals are in the display sub-region and used for fixing pins of a pixel driving chip respectively, and the multiple second connection terminals are used for fixing a plurality of conductive pins, which are coupled to each of the plurality of signal lines, of a flexible circuit board in the bonding sub-region; and at least one of the multiple first connection terminals and/or at least one of the multiple second connection terminals are/is couple to at least one of the plurality of leading-out wires.

11. The driving substrate of claim 10, wherein the plurality of leading-out wires are in the second conductive pattern layer.

12. The driving substrate of claim 10, wherein the plurality of leading-out wires are respectively directly coupled to corresponding connection terminals or are respectively coupled to the corresponding connection terminals through conductive structures which are in the second conductive pattern layer, and the plurality of leading-out wires do not overlap with the plurality of signal lines in a direction perpendicular to the second substrate base.

13. The driving substrate of claim 10, wherein the plurality of leading-out wires has a line width in a range from 50 um to 200 um in a direction parallel to the second substrate base.

14. The driving substrate of claim 13, wherein the plurality of leading-out wires has a line width of 100 um.

15. The driving substrate of claim 10, further comprising:

at least one second insulating layer on a side of the second conductive pattern layer distal to the second substrate base; and vias in the at least one second insulating layer at positions corresponding to where the plurality of connection terminals and the plurality of detection terminals are located, respectively, to expose the plurality of connection terminals and the plurality of detection terminals.

16. A display device, comprising: a driving substrate of claim 10 and a driving circuit for driving the driving substrate.

17. A method for manufacturing the substrate motherboard of claim 1, comprising:

providing a first substrate base, wherein the first substrate base comprises an active region for a driving substrate and a non-active region surrounding the active region;

forming a first conductive pattern layer on the first substrate base such that the first conductive pattern layer comprises a plurality of signal lines in the active region;

forming at least one first insulating layer on a side of the first conductive pattern layer distal to the first substrate base; and forming a second conductive pattern layer on a side of the at least one first insulating layer distal to the first substrate base such that the second conductive pattern layer comprises a plurality of connection terminals in the active region, a plurality of leading-out wires, and a plurality of detection terminals, the plurality of connection terminals are electrically coupled to corresponding signal lines of the plurality of signal lines, the plurality of detection terminals are in the non-active region, first ends of the plurality of leading-out wires are respectively electrically coupled to at least one of the plurality of connection terminals, and the plurality of leading-out wires extend to the non-active region to be electrically coupled to corresponding detection terminals through second ends of the plurality of leading-out wires, wherein the forming a second conductive pattern layer on a side of the at least one first insulating layer distal to the first substrate base comprises:

forming a second conductive material film; and performing a patterning process on the second conductive material film to form patterns of the plurality of connection terminals, the plurality of leading-out wires and the plurality of detection terminals.

* * * * *